US006266367B1

(12) United States Patent
Strait

(10) Patent No.: US 6,266,367 B1
(45) Date of Patent: Jul. 24, 2001

(54) COMBINED ECHO CANCELLER AND TIME DOMAIN EQUALIZER

(75) Inventor: Jeffrey C. Strait, Penn Valley, CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/086,395

(22) Filed: May 28, 1998

(51) Int. Cl.$^7$ ........................................ H03H 7/30
(52) U.S. Cl. .................... 375/229; 375/229; 370/286
(58) Field of Search .................... 375/285, 231, 375/229; 370/201, 286; 379/406, 410, 411

(56) References Cited

U.S. PATENT DOCUMENTS

| 5,095,497 | * | 3/1992 | Aman et al. | 375/34 |
| 5,260,972 | * | 11/1993 | Wang | 375/58 |
| 5,285,474 | * | 2/1994 | Chow et al. | 375/13 |
| 5,317,596 | * | 5/1994 | Ho et al. | 375/14 |
| 5,479,503 | * | 12/1995 | Fujiwara | 379/402 |
| 5,623,513 | * | 4/1997 | Chow et al. | 375/219 |
| 5,790,658 | * | 8/1998 | Yip et al. | 379/406 |
| 5,796,820 | * | 8/1998 | Sasada | 379/410 |
| 5,832,032 | * | 11/1998 | Overbury | 375/285 |
| 5,864,545 | * | 1/1999 | Gonikberg et al. | 370/286 |

* cited by examiner

Primary Examiner—Stephen Chin
Assistant Examiner—Tony Al-Beshrawi
(74) Attorney, Agent, or Firm—McDonnell Boehnen Hulbert & Berghoff

(57) ABSTRACT

A method and structure that reduces the computational requirements of both echo cancellation and time domain equalization in symmetrical transceivers. The structure exploits pole-zero modeling of both the echo and transmission path response in order to realize an improved level of system performance with shorter filters than would be required with direct FIR modeling.

15 Claims, 4 Drawing Sheets

COMBINED ECHO CANCELLER AND TIME DOMAIN EQUALIZER

BACKGROUND OF THE INVENTION

A. Field of the Invention

The present invention relates to a method and device for compensating for channel and echo distortion in a communication receiver. Specifically the invention relates to an equalization method and structure for efficiently eliminating near end echoes while also equalizing the receive data to compensate for channel distortion. The invention is particularly useful in DMT modulation as typically used in ADSL transceivers.

B. Description of the Related Art

1. Echo Cancellation

Full duplex data transmission over a single twisted pair of wires is the simultaneous transmission of data in both directions. The equipment at both ends transmits signals to the two wires and receives signals from the same wires through the use of a hybrid device. The hybrid is also commonly referred to as a four-wire to two-wire converter because it converts a four wire circuit consisting of a transmit pair of wires and a receive pair of wires into a single two wire circuit. When the signals transmitted by both end stations occupy the same frequency band, confusion may result when a receiver attempts to distinguish a signal received from the distant end from its own transmitted signal.

The simplest and most well known technique of eliminating such near-end echoes is the analog technique of impedance balancing the hybrid circuit. The transmit signal placed on the two-wire full-duplex circuit also appears as an input to the receive side of the hybrid. The exact nature of the local echo signal that appears on the input of the hybrid will depend upon the impedance of the two-wire full-duplex line. The hybrid therefore attempts to model the impedance on the full-duplex two-wire line in order to create a local replica of the transmitted signal that will appear at its input. The hybrid then subtracts this local replica from the received signal, which includes the echo, leaving only the signal that was transmitted by the distant end data transmitter.

Because the impedance model is not perfect, attenuated and distorted echoes are mixed with the received signal. Data driven adaptive techniques have been developed to address the problem and to provide improved echo cancellation. These include well-known fixed solutions such as least squares method, and the well-known adaptive gradient algorithms. A simple baseband model of one adaptive gradient technique is shown in FIG. 1. Transmit symbols $a_n$ are converted to an analog signal at D/A converter 110. The echo signal $u_t$ is a distorted version of the transmit symbols represented by the signal $a_t$ filtered by filter G(t) 120. Echo canceller 100 also receives the transmit sequence $a_n$. The received signal $x_t$ is the sum of the echo $u_t$, the signal $r_t$, from the distant end, and noise $w_t$, and is sampled in A/D converter 130. The echo canceller 100 utilizes a stochastic gradient algorithm, also known as an LMS algorithm, based on an N-tap adaptive linear transversal filter to generate an estimate $u_n$ of the echo signal $u_n$, which is the component of $x_n$ contributed by the sampling of $u_t$. The filter taps are updated using the following algorithm:

$$\vec{c}_{n+1} = \vec{c}_n + \alpha z_n \vec{a}_n$$

where $\vec{c}_{n+1}$ is a vector with the updated filter taps, $\vec{c}_n$ is a vector with the previous set of filter taps, $\vec{a}_n$ is a vector containing the most recent data symbols, $z_n$ is the signal remaining after the echo estimate has been subtracted, and $\alpha$ is the adaptation gain.

These and other digital signal processing techniques provide large echo attenuation. Such techniques have only been made practical by the computational capabilities of modern microprocessors. Even so, many sophisticated techniques over-burden today's microprocessors. Generally speaking, the length of the echo cancellation filter is determined by the duration of the echo impulse response G(t), and it is well known that the complexity of the algorithms increases with the increase in length of the filter.

2. Channel Equalization

Similar fixed and adaptive filter techniques are used to remove the effects of distortion imposed by the transmission channel, i.e., the two-wire circuit and the accompanying analog electronics of the transmitter and receiver. Channel equalizers using the LMS algorithm are effective at removing inter-symbol interference (ISI) that results from the symbols being spread out into adjacent symbol periods by the channel impulse response. Initially, adaptive equalizers are trained by the transmission of a training sequence. The training sequence is known to both the transmitter and the receiver. This allows the equalizer in the receiver to adjust its filter coefficients to minimize an error criterion. Once trained, the adaptive equalizer uses data decisions to determine the error, relying on the assumption that data errors will be infrequent. The filter may be allowed to continually adjust itself based on the error, or remain fixed after training.

As with echo cancellation, the complexity of equalization algorithms increase with the length of the equalization filters, which is in turn determined by the duration of the channel impulse response.

3. Asymmetric Digital Subscriber Lines

Asymmetric Digital Subscriber Line (ADSL) is a communication system that operates over existing twisted-pair telephone lines between a central office and a residential or business location. It is generally a point-to-point connection between two dedicated devices, as opposed to multi-point, where numerous devices share the same physical medium.

ADSL supports bit transmission rates of up to approximately 6 Mbps in the downstream direction (to a subscriber device at the home), but only 640 Kbps in the upstream direction (to the service provider/central office). ADSL connections actually have three separate information channels: two data channels and a POTS channel. The first data channel is a high-speed downstream channel used to convey information to the subscriber. Its data rate is adaptable and ranges from 1.5 to 6.1 Mbps. The second data channel is a medium speed duplex channel providing bi-directional communication between the subscriber and the service provider/central office. Its rate is also adaptable and the rates range from 16 to 640 kbps. The third information channel is a POTS (Plain Old Telephone Service) channel. The POTS channel is typically not processed directly by the ADSL modems—the POTS channel operates in the standard POTS frequency range and is processed by standard POTS devices after being split from the ADSL signal.

The American National Standards Institute (ANSI) Standard T1.413, the contents of which are incorporated herein by reference, specifies an ADSL standard that is widely followed in the telecommunications industry. The ADSL standard specifies a modulation technique known as Discrete Multi-Tone modulation.

4. Discrete Multi-Tone Modulation

Discrete Multi-Tone (DMT) uses a large number of subcarriers spaced close together. Each subcarrier is modulated using a type of Quadrature Amplitude Modulation (QAM). Alternative types of modulation include Multiple Phase Shift Keying (MPSK), including BPSK and QPSK, and Differential Phase Shift Keying (DPSK). The data bits are mapped to a series of symbols in the I-Q complex plane, and each symbol is used to modulate the amplitude and phase of one of the multiple tones, or carriers. The symbols are used to specify the magnitude and phase of a subcarrier, where each subcarrier frequency corresponds to the center frequency of the "bin" associated with a Discrete Fourier Transform (DFT). The modulated time-domain signal corresponding to all of the subcarriers can then be generated in parallel by the use of well-known DFT algorithm called Inverse Fast Fourier Transforms (IFFT).

The symbol period is relatively long compared to single carrier systems because the bandwidth available to each carrier is restricted. However, a large number of symbols is transmitted simultaneously, one on each subcarrier. The number of discrete signal points that may be distinguished on a single carrier is a function of the noise level. Thus, the signal set, or constellation, of each subcarrier is determined based on the noise level within the relevant subcarrier frequency band.

Because the symbol time is relatively long and follows a guard band, intersymbol interference is a less severe problem than with single carrier, high symbol rate systems. Furthermore, because each carrier has a narrow bandwidth, the channel impulse response is relatively flat across each subcarrier frequency band. The DMT standard for ADSL, ANSI T1.413, specifies 256 subcarriers, each with a 4 kHz bandwidth. Each sub-carrier can be independently modulated from zero to a maximum of 15 bits/sec/Hz. This allows up to 60 kbps per tone. DMT transmission allows modulation and coding techniques to be employed independently for each of the sub-channels.

The sub-channels overlap spectrally, but as a consequence of the orthogonality of the transform, if the distortion in the channel is mild relative to the bandwidth of a sub-channel, the data in each sub-channel can be demodulated with a small amount of interference from the other sub-channels. For high-speed wide-band applications, it is common to use a cyclic-prefix at the beginning, or a periodic extension at the end of each symbol, in order to maintain orthogonality. Because of the periodic nature of the FFT, no discontinuity in the time-domain channel is generated between the symbol and the extension. It has been shown that if the channel impulse response is shorter than the length of the periodic extension, sub-channel isolation is achieved.

SUMMARY OF THE INVENTION

A method and apparatus for combining echo cancellation (EC) and time domain equalization (TEQ) for a discrete multi-tone (DMT) modulation transceiver system for digital subscriber lines (xDSL) is provided. The structure reduces the required computational complexity for both the echo canceller and the equalizer. The structure and method is generally applicable to a symmetric xDSL system, meaning the central office terminal (COT) and the remote terminal (RT) ideally have identical analog hardware realizations. The method also requires that the hybrid characteristic through the transmission path to be approximately the same as the echo path. That is, the transmission characteristic of the hybrid is about the same as the trans-hybrid loss characteristic.

Structural efficiency results from modeling the effective channel transfer function as the product of the actual channel's (pole-zero) transfer function and the analog front end's (pole-zero) transfer function. By factoring the overall response as described, the proposed filter structure selectively shortens the echo impulse response in a way that simultaneously shortens the transmission path's impulse response. The shortened echo impulse response allows a reduced complexity echo canceller while simultaneously reducing the structural requirements of the equalizer. Cost savings result since the computational complexity of DSP algorithms such as echo cancellation and equalization are directly related to the size of the filter structures used in each case.

BRIEF DESCRIPTION OF THE DRAWINGS

The objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 1:
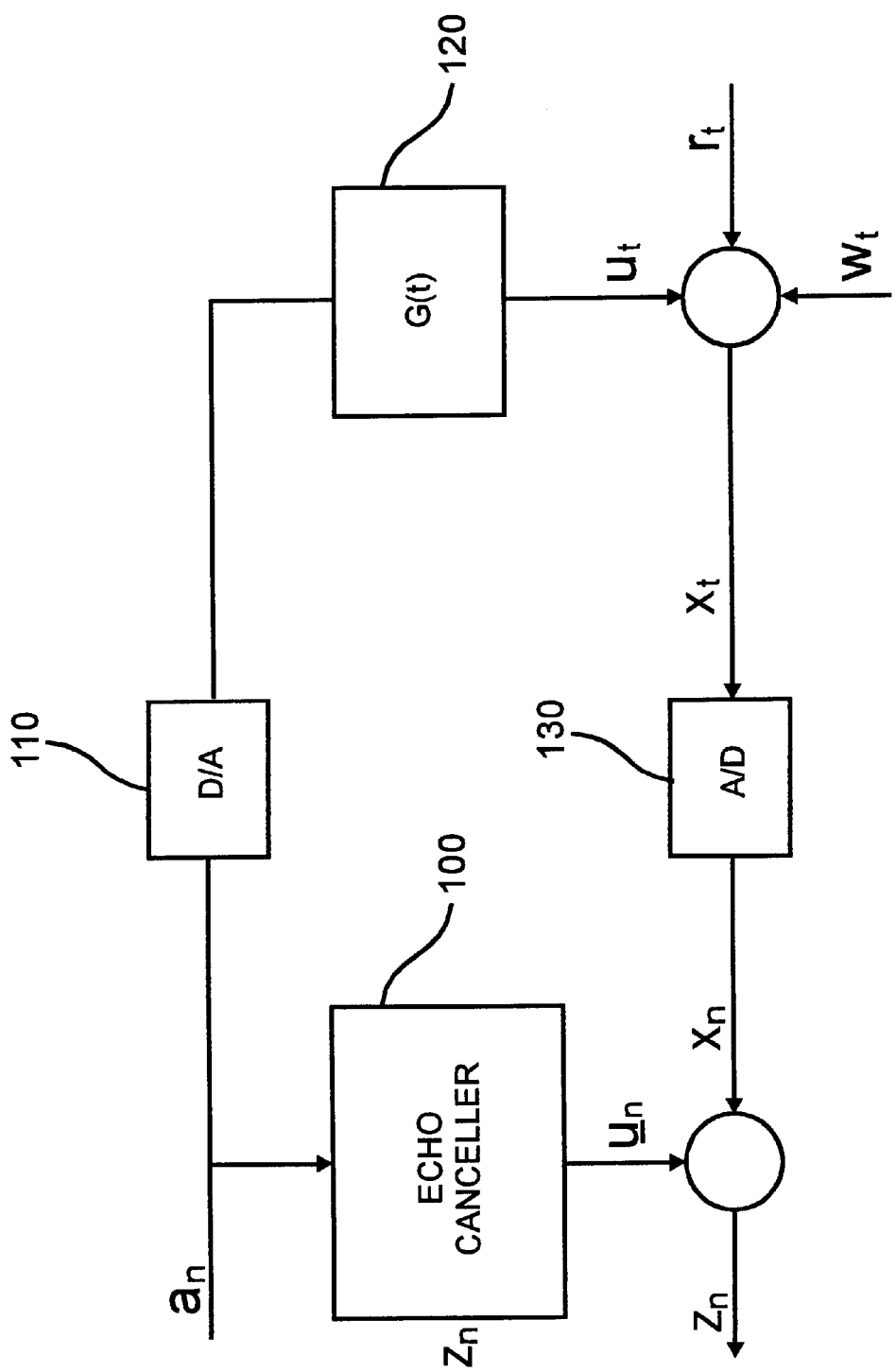
FIG. 1 depicts a prior art echo canceller.
Figure 2:
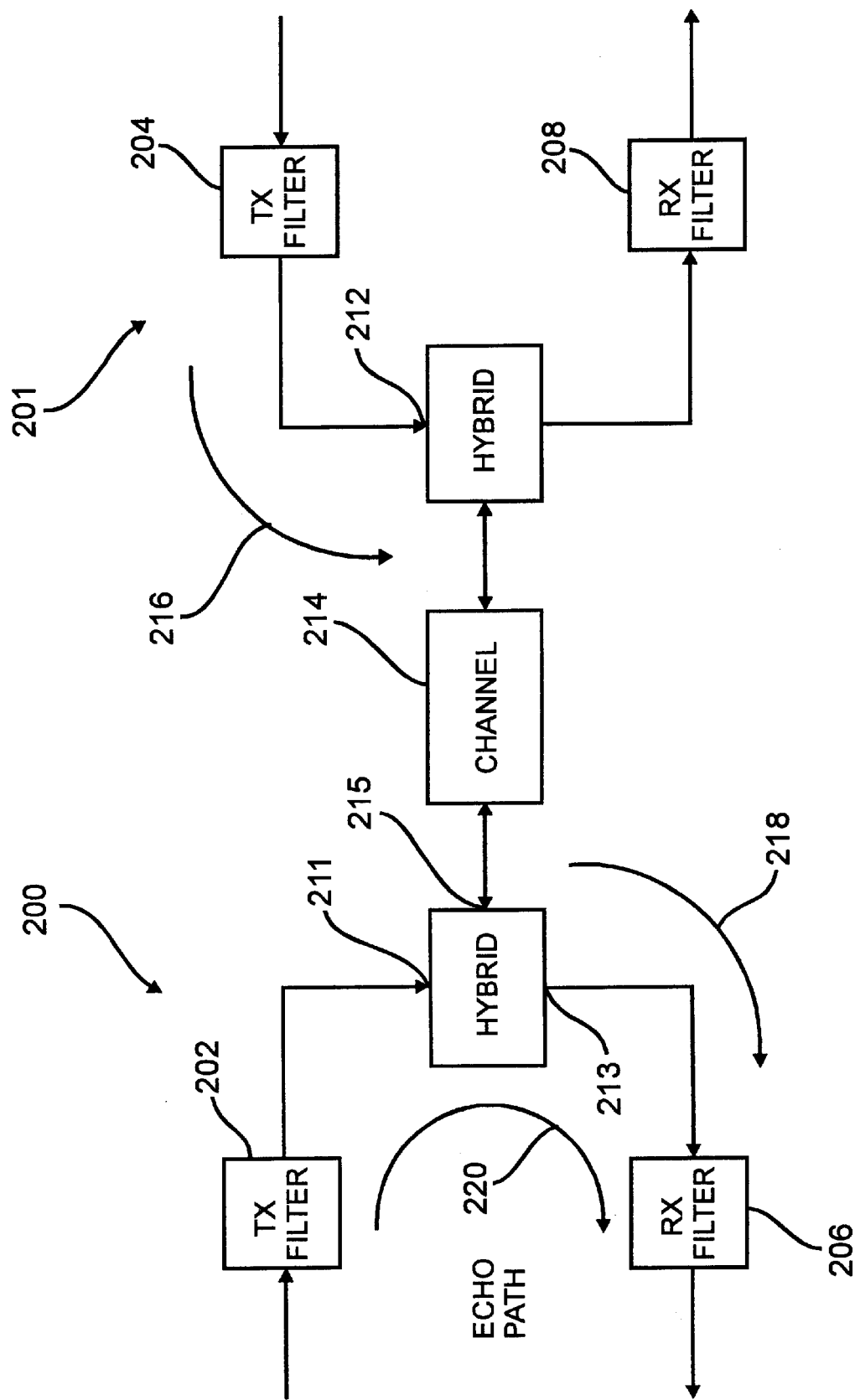
FIG. 2 shows a full-duplex transmission system.

The system of FIG. 2 shows the components of a communication system that largely determine the characteristics of the transmission channel and an echo channel. The system depicts the front end of a local transceiver 200 and a distant end transceiver 201. The front ends include a local transmit filter 202, a remote transmit filter 204, a local receive filter 206 and a distant receive filter 208, and hybrid circuits 210, 212. The two transceivers 200, 201 are connected via channel 214. The transmit path from the distant end transceiver to the local transceiver is shown by path 216, 218, while a local echo signal path is shown by path 220.

The transmit and receive signal paths within a transceiver are independent, but are combined for transmission and reception over a shared medium via hybrids 210 and 212. Hybrids 210 and 212 are commonly known as four-wire to two-wire converters and include a two-wire transmit port 211, a two-wire receive port 213, and a two wire full-duplex port 215.

The medium is channel 214 having a transfer function $G(\omega)$, which is modeled as a digital filter having transfer function $G(z)$. Specifically, $G(z)$ is considered to have a transfer function of the form $$G(z) = \frac{B(z)}{A(z)} = \frac{\sum_{i=0}^{L} b(i)z^{-i}}{\sum_{j=0}^{P} a(j)z^{-j}}.$$

The roots of the numerator polynomial $B(z)$ are commonly referred to as zeros of the channel 214, while the roots of the denominator polynomial are referred to as the poles of the channel 214. The poles of the channel, or of any filter, typically contribute a component of the impulse response that is infinite in duration (commonly known as an infinite impulse response, or IIR), while zeros contribute a finite impulse response (FIR) component. Channel 214 is typically a two-wire line from a central office to a subscriber location, but may include any type of communication channel, including a wireless transmission link having additional radio frequency transceivers.

The frequency response of the channel is largely determined by the transmission line, typically a twisted pair of wires. Modeling of the transmission line as a ratio of polynomials having distinct poles and zeros is, of course, a lumped element approximation of the distributed transmission line characteristics. The model thus provides dominant poles and zeros, which are a set of discrete poles and zeros that provide a similar frequency response in the frequency range of interest. Additionally, there could in actuality be an infinite number of poles and/or zeros that have little or no measurable effect on the response in the frequency range of interest—these poles and zeros would not be dominant ones. The filter algorithms calculate coefficient values which form a best fit between the response of the filter structure and the shape of the frequency response of the physical system that is being modeled.

The properties of the transmit and receive filters 202, 204, 206, 208 are determined in part by the type of modulation and the spectral usage of the particular communication system. If the system is asymmetric in its spectral usage, i.e., the frequency bands used for transmission are not the same for each transmitter, then the filters are designed to accommodate the desired frequency range. However, the apparatus and method described herein operate most effectively in a symmetric system, where the same frequency ranges are used to transmit in both directions. Furthermore, the transmit and receive filters of the transceivers are preferably designed to be consistent from one to another, meaning that their characteristics, as determined by the dominant poles and zeros of the filters, are identical.

If the system is symmetric, then a low pass, high pass or band pass type filter may nevertheless be employed to shape the signal or to otherwise remove unnecessary signal components. Preferably the transmit filters are the same and the receive filters are the same in both transceivers.

The filters 202, 204, 206, 208 may also include filters associated with analog-to-digital (A/D) and digital-to-analog (D/A) conversion. A/D converters often use low pass filters to prevent aliasing of higher frequency components into lower frequencies, and D/A converters often use low pass filters to shape the output signal to remove a "stair-step" appearance resulting from the conversion process.

In addition, for modeling convenience, the filters 202, 204, 206, 208, may include poles and zeros that are actually associated with the hybrid circuits 210, 212, or other components of the analog front end of a transceiver. Preferably, the hybrids exhibit a flat response and do not contribute much to the overall transfer function H(z). To the extent that the hybrids do have a contribution, it is desirable that the trans-hybrid characteristic of both hybrids combined is the same as the hybrid's echo path characteristic. Similarly, the other analog components are preferably symmetric in the same manner, and may be designed to be symmetric.

The combination of any one of the transmit filters 202, 204, with any one of the receive filters 206, 208 (together with any other analog front end filter characteristics) are modeled as a single filter expressed as a ratio of polynomials, having the form $$H(z) = \frac{D(z)}{C(z)} = \frac{\sum_{i=0}^{Q} d(i)z^{-i}}{\sum_{j=0}^{M} c(j)z^{-j}}$$

where the poles of the filter are the roots of the polynomial C(z), and the zeros of the filter are the roots of the polynomial D(z). The poles and zeros of the transmit and receive filters combine to form the overall transfer function H(z). Because the transmit filters are the same and the receive filters are the same in both transceivers, the combination of filters in the data transmission path 216, 218 consisting of distant end transmit filter 204 and receive filter 206 yields the same transfer function H(z) as the combination of filters in the local echo path 220 consisting of the local transmit filter 202 and local receive filter 206.

The modeled filter having the collective transfer function H(z) is referred to herein as the front end filter, and includes poles and zeros associated with the analog front end such the hybrid circuit, transmit and receive filters, and analog components such as amplifiers, mixers, and the like.

The effective overall channel model is the product of H(z) and G(z)

$$H(z)G(z) = \frac{D(z)}{C(z)} \frac{B(z)}{A(z)} = \frac{\sum_{i=0}^{Q} d(i)z^{-i}}{\sum_{j=0}^{M} c(j)z^{-j}} \frac{\sum_{k=0}^{L} b(i)z^{-k}}{\sum_{l=0}^{P} a(j)z^{-l}},$$

which represents the transfer function of the signal path 216, 218 from the transmitter of the distant end transceiver to the local receiver. The overall model of the local echo signal path is simply H(z).

Figure 3:
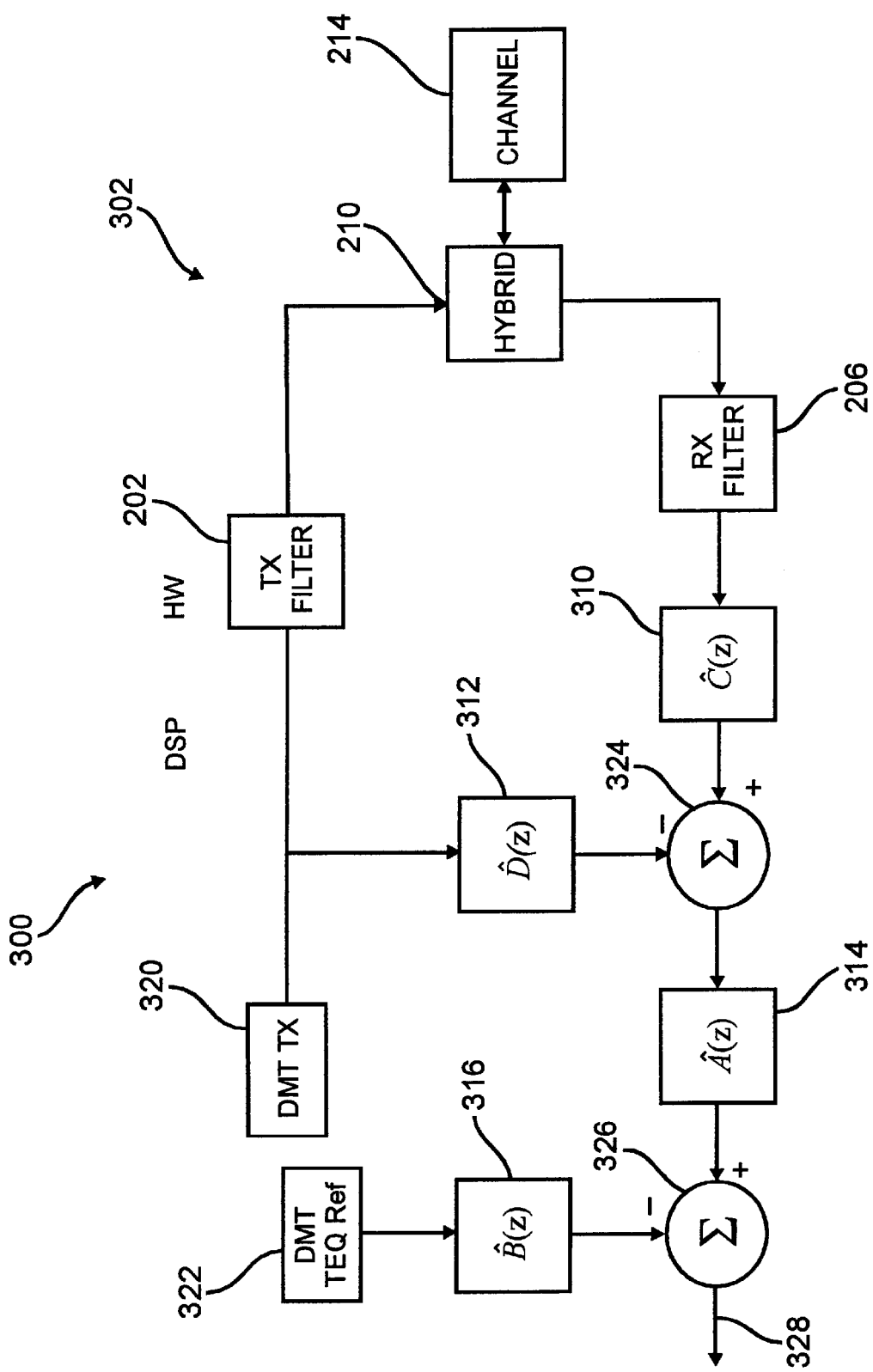
FIG. 3 shows the combined EC-TEQ pole-zero structure.

A preferred echo cancellation and equalizer device is shown in FIG. 3. The device is preferably used in both the local and far end transceivers, but is illustrated and discussed herein with reference to the local transceiver. The Figure includes analog components 302 and digital components 300 typically implemented on a digital signal processor (DSP). A D/A and A/D converter (not shown) provide the interface between the analog and digital processing components. The device components include a front end pole canceling filter 310, echo canceller filter 312, summers 324 and 326, channel pole canceling filter 314 and channel zero filter 316. Note that the filters in the structure of FIG. 3 use the polynomials $\hat{A}(z)$, $\hat{B}(z)$, $\hat{C}(z)$, and $\hat{D}(z)$ to estimate A(z), B(z), C(z), and D(z), respectively.

The transmitted data is supplied by digital data source 320, which is also the source for any training sequences transmitted by the local transceiver. A local copy of a predetermined training sequence that is sent by the distant end transmitter is provided to the channel zero filter 316 by reference source 322.

The combined echo canceller and time-domain equalizer described herein has particular advantages when used in a system utilizing a discrete multi-tone modulation format. Specifically, DMT modulation typically employs a cyclic prefix (or cyclic extension) to permit recovery of the signal after distortion by the channel. The techniques described herein allow a reduction in the required length of the cyclic prefix, and a reduction in the processing associated with echo cancelling and equalization.

In standard DMT modulation, each N-sample encoded symbol is prefixed with a cyclic extension to allow signal recovery using the cyclic convolution property of the discrete Fourier transform. If the length of the cyclic prefix, L, is greater than or equal to the length of the impulse response, the linear convolution of the transmitted signal with the channel becomes equivalent to circular convolution (disregarding the prefix). The frequency indexed DFT output sub-symbols are merely scaled in magnitude and rotated in phase from their respective encoded values by the circular convolution. The original symbols are then recovered using a bank of single tap frequency domain equalizers (FEQ) following the time domain equalization and DFT demodulation. This normalizes the DFT coefficients allowing uniform QAM decoding.

Poles of the channel and the front end are associated with an IIR response that greatly increases the duration of the impulse response. By canceling the poles with an adaptive time domain equalizer (TEQ), the length of the response is decreased. Once the poles have been canceled, its length is largely determined by the order of the numerator polynomials of the channel and front end. The time domain equalizer consists of frontend pole canceling filter 310 and channel pole canceling filter 314.

Thus, by the use of the unique filter structure in the combined echo canceller and equalizer shown in FIG. 3, the overall impulse response of the channel and front end is effectively shortened, thereby reducing the required length of the cyclic extension, and allowing the recovery of the DMT symbols with the use of an FEQ (not shown). The FEQ is used to process the signals appearing on line 328 of FIG. 3 after those signals are converted to the frequency domain via, e.g., an FFT algorithm.

A further advantage of the structure of FIG. 3 is that portions of the echo canceller (EC) and time domain equalizer may be combined by recognizing the existence of front end poles that are identical in the local echo signal path 220 and the receive signal path 216, 218 from the distant end. By modeling the overall response as the product of the actual channel response and the analog hardware response, the TEQ is segmented into filter 310 to first cancel the poles of the analog front-end hardware and filter 314 to then cancel the poles of the channel.

The advantage of first canceling the front-end hardware poles is that it enables a reduced complexity echo canceller 312 whose only task is to model the zeros of the hardware echo path. Canceling the poles C(z) shortens the impulse response of echo path 220 while simultaneously shortening the impulse response of the transmission path 216, 218. The equalization techniques described above follow subsequently with further reduction of the complexity. The structure allows sequential optimization of the EC and the TEQ using familiar stochastic gradient adaptive algorithms.

By first training front-end pole canceling filter 310 and echo canceling filter 312 to generate an estimate of the echo path, the poles C(z), which is the denominator polynomial of H(z), are canceled. Then the equation error TEQ is trained. Normally, the TEQ must model all the poles of the overall channel response:

$$C(z)A(z) = \left(\sum_{j=0}^{M} c(j)z^{-j}\right)\left(\sum_{l=0}^{P} a(j)z^{-l}\right).$$

However, since the EC first cancels C(z), the number of degrees of freedom for the TEQ required to equalize the effective channel is reduced by M+1. Thus front-end pole filter 310 performs both an echo canceling function and a channel equalization function.

A wide variety of algorithms may be used to calculate the optimum coefficients for the filters of the structure shown in FIG. 3, and the structure can be modified slightly to reflect the various equation error modeling techniques. Also, a bias remedy may be used during training to compensate for any coefficient bias caused by additive channel noise.

Figure 4:
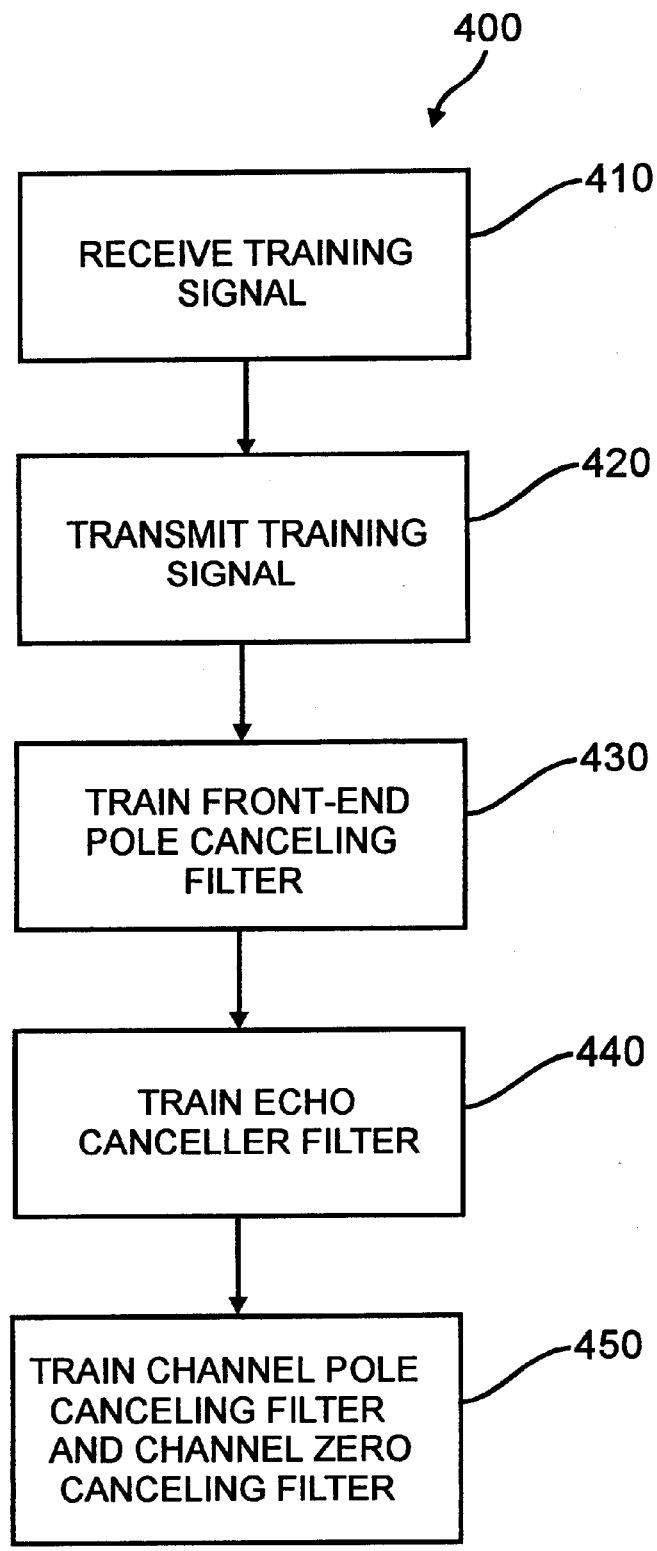
FIG. 4 shows a flowchart for training the EC-TEQ filters.

The training procedure 400 for the proposed structure is depicted in FIG. 4. At step 410 a training signal is received from a distant end transceiver. A training signal is transmitted to the distant end receiver at step 420. Steps 410 and 420 may be performed in reverse order, or simultaneously. However, some filter algorithms used for training the front-end pole canceling filter may require that the distant end transmitter maintain silence during training. Thus under the conditions, the transmitting step 420 is performed prior to receiving step 410, and only the local echo signal is received. The training of the front-end pole canceling filter 310 is performed at step 430. The pole canceling filter 310 removes distortion from the received training signal (when present) and the local echo signal (when present), where the distortion of the received training signal is associated with the dominant poles of the distant end transmit filter and the local receive filter, and the distortion of the local echo signal that is associated with the dominant poles of the local transmit filter and local receive filter. Next, at step 440, the echo canceller filter 312 is trained. The echo canceller filter 312 generates a replica of the local echo signal (based on a zero-only model) that is then subtracted from the received signal at summer 324. Steps 430 and 440 are preferably performed simultaneously to allow the correct convergence of the filters.

At step 450, the remaining filters are trained. These include the channel pole canceling filter 314 and channel zero canceling filter 316. In addition, once the front-end pole canceling filter 310 and echo canceller filter 312 are trained, their coefficients are preferably fixed. Similarly, the coefficients of the channel pole canceling filter 314 are fixed after training. Of course, the channel zero canceling filter 316 is present only to assist the convergence of channel pole canceling filter 314, and is not used during regular data transmission. The adaptive FEQ is used to remove the overall channel zeros from the received signal via circular de-convolution as explained above.

The specific algorithm used to update or calculate coefficient values can be either stochastic gradient adaptive algorithms such as LMS or exact solution methods such as least squares. The first step is to train the echo canceller by adjusting its coefficients to minimize the received echo at the output of the first summation block 324. A local replica of the echo signal is generated by filter 312 that is then subtracted from the output of filter 310 in summer 324.

After suitable echo error attenuation the polynomials Ĉ(z), and D̂(z) are fixed. Equalizer training follows sequentially using a locally known reference signal provided by block 322. After obtaining an acceptable level of convergence based on the error at the output of the second summation, the polynomial Â(z) becomes fixed and B̂(z) is discarded. The effects of the zeros of the overall channel response are removed during normal receiver operation by the FEQ, as described above. Any subsequent system variations such as clock jitter or temperature dependent changes are also tracked using the continually adapting FEQ.

A method and structure that reduces the computational requirements of both echo cancellation and time domain equalization in symmetrical transceivers has been provided. The structure exploits pole-zero modeling of both the echo and transmission path response in order to realize a specific level of system performance with shorter filters than would be required with direct FIR modeling.

A preferred embodiment of the present invention has been described herein. It is to be understood, of course, that changes and modifications may be made in the embodiment without departing from the true scope of the present invention, as defined by the appended claims. In particular, it is understood that the filter structures described herein may be implemented in dedicated hardware such as an ASIC, or as program instructions carried out by a microprocessor.

What is claimed is:

1. A combined echo canceller and equalizer for use in a transceiver that is matched to a distant end transceiver, wherein the echo canceller removes a local echo signal from a received signal and the equalizer removes channel distortion from the received signal, said combined echo canceller and equalizer comprising:
   a digital data source;
   a local training sequence source;
   a hybrid circuit having a full duplex port for connection to a two-wire transmission line over which data signals are sent and received, a transmit port connected to said digital data source, and a receive port;
   a front-end pole canceling filter connected to said receive port;
   an echo canceller filter connected to said digital data source;
   a first summer connected to said echo canceller filter and said front-end pole canceling filter;
   a channel pole canceling filter connected to said first summer;
   a channel zero canceling filter connected to said local training sequence source;
   a second summer connected to said channel pole canceling filter and said channel zero canceling filter, and having an output for providing a partially equalized and substantially echo free signal.

2. The combined echo canceller and equalizer of claim 1, further comprising a frequency domain equalizer connected to said second summer for canceling the effects of the channel and front-end zeros.

3. The combined echo canceller and equalizer of claim 1, wherein said channel zero canceling filter is active only during a training period.

4. The combined echo canceller and equalizer of claim 1, wherein at least one of said front-end pole canceling filter, said echo canceller filter, said channel pole canceling filter and said channel zero canceling filter are trained using an algorithm selected from the set of algorithms of least squares and stochastic gradient adaptation.

5. The combined echo canceller and equalizer of claim 1, further comprising a local transmit filter for filtering signals received on said transmit port and output on said full-duplex port, and a local receive filter for filtering signals received on said full-duplex port and output on said receive port.

6. The combined echo canceller and equalizer of claim 5, wherein said front-end pole canceling filter simultaneously removes distortion of the received signal associated with the dominant poles of a distant end transmit filter and said local receive filter, and distortion of a local echo signal associated with the dominant poles of said local transmit filter and said local receive filter.

7. The combined echo canceller and equalizer of claim 6 further comprising a frequency domain equalizer connected to said second summer to remove distortion associated with the zeros of the channel, the distant end transmit filter and said local receive filter.

8. A method of training a combined echo canceller and equalizer comprising the steps of:
   receiving a training signal from a distant end transceiver;
   transmitting a training signal to the distant end receiver and receiving a corresponding local echo signal;
   training a front-end pole canceling filter that removes distortion from the received training signal and the local echo signal, the distortion of the received training signal being associated with the dominant poles of a distant end transmit filter and a local receive filter, and the distortion of the local echo signal being associated with the dominant poles of a local transmit filter and local receive filter;
   training an echo canceller filter to generate a replica of the local echo signal;
   training a channel pole canceling filter and channel zero canceling filter.

9. The method of claim 8, wherein the transmitting step is performed after the step of training a front end pole canceling filter.

10. The method of claim 8, wherein the transmitting and receiving steps are performed simultaneously.

11. The method of claim 8, wherein the step of training a front-end pole canceling filter includes performing an adaptive gradient algorithm.

12. The method of claim 8, wherein the step of training an echo canceller filter includes performing an adaptive gradient algorithm.

13. The method of claim 8, wherein the step of training a channel pole canceling filter and channel zero canceling filter includes performing an adaptive gradient algorithm.

14. The method of claim 8, wherein the steps of training a front-end pole canceling filter and training an echo canceller filter are performed simultaneously.

15. A combined equalizer and echo canceller for removing a local echo signal and reducing channel distortion in a system having two transceivers that communicate over a channel having dominant channel poles and zeros, each transceiver having transmit and receive filters having dominant front-end poles and zeros, said combined equalizer and echo canceller comprising:
   a first filter that cancels signal distortion associated with the dominant front-end poles of the transmit and receive filters;
   a second filter that generates a replica of a local echo signal;
   a third filter that cancels signal distortion associated with the dominant poles of the channel; and,
   a fourth filter that generates a replica of the received training sequence; whereby signal distortion from the channel and local echoes is reduced.

* * * * *